United States Patent
Yom

(10) Patent No.: US 9,660,143 B2
(45) Date of Patent: May 23, 2017

(54) SUBSTRATE AND LIGHT EMITTING DIODE

(71) Applicant: Hongseo Yom, Gyeonggi-do (KR)

(72) Inventor: Hongseo Yom, Gyeonggi-do (KR)

( * ) Notice: Subject to any disclaimer, the term of this patent is extended or adjusted under 35 U.S.C. 154(b) by 0 days.

(21) Appl. No.: 15/026,731

(22) PCT Filed: Oct. 6, 2014

(86) PCT No.: PCT/KR2014/009394
§ 371 (c)(1),
(2) Date: Apr. 1, 2016

(87) PCT Pub. No.: WO2015/053520
PCT Pub. Date: Apr. 16, 2015

(65) Prior Publication Data
US 2016/0233382 A1    Aug. 11, 2016

(30) Foreign Application Priority Data
Oct. 7, 2013    (KR) .................. 10-2013-0119941

(51) Int. Cl.
*H01L 33/22*    (2010.01)
*H01L 33/24*    (2010.01)

(52) U.S. Cl.
CPC .................. *H01L 33/24* (2013.01)

(58) Field of Classification Search
CPC .................. H01L 33/32; B82Y 20/00
(Continued)

(56) References Cited

U.S. PATENT DOCUMENTS 6,177,352 B1 * 1/2001 Schonfeld ......... H01L 21/30621
257/E21.222
6,214,427 B1 * 4/2001 Levinson .................. C30B 1/02
117/4

(Continued)

FOREIGN PATENT DOCUMENTS

KR    1010-2009-0068875 A    6/2009
KR    10-2012-0040854 A    4/2012

(Continued)

OTHER PUBLICATIONS

Chang et al, "Nitride-Based LEDs With Textured Side Walls," IEEE Photonics Technology Letters, vol. 16, No. 3, Mar. 2004, pp. 750-752.

(Continued)

*Primary Examiner* — Jami M Valentine
(74) *Attorney, Agent, or Firm* — Dilworth & Barrese, LLP

(57) ABSTRACT

The present invention relates to a substrate having an upper surface that is not parallel to a reference plane, wherein the substrate may include the upper surface or an upper layer which is inclined or inflexed. In addition, the present invention relates to a light emitting diode comprising an active layer that is not parallel to a reference plane. The light emitting diode of the present invention may be characterized in that the active layer is inflexed. Furthermore, the light emitting diode of the present invention may be characterized in that the side wall of the light emitting diode is inflexed. Moreover, the light emitting diode of the present invention may be characterized in that the side wall of the light emitting diode is inflexed and inclined. Through the configuration, the size of a chip is identically maintained, and the area of the active layer for emitting light is increased. In addition, the area of the exposed active layer at the edge of the chip is increased, and light emitted from the side surface (Continued)

thereof is oriented toward the front side thereof, thereby enhancing a utilization rate of the emitted light.

2 Claims, 31 Drawing Sheets

(58) Field of Classification Search
USPC .......................................................... 257/101
See application file for complete search history.

(56) References Cited

U.S. PATENT DOCUMENTS

| | | | |
|---|---|---|---|
| 2006/0169997 A1* | 8/2006 | Suzuki | H01L 33/20 257/95 |
| 2007/0085955 A1* | 4/2007 | Kimura | G02F 1/133371 349/129 |
| 2008/0303042 A1* | 12/2008 | Minato | H01L 33/10 257/98 |
| 2009/0039362 A1* | 2/2009 | Han | H01L 33/20 257/94 |
| 2012/0299040 A1* | 11/2012 | Kim | H01L 33/20 257/98 |
| 2012/0307178 A1* | 12/2012 | Cheng | G02F 1/133524 349/62 |
| 2013/0009188 A1* | 1/2013 | Hsu | H01L 33/007 257/98 |
| 2014/0231841 A1* | 8/2014 | Wang | H01L 33/12 257/98 |

FOREIGN PATENT DOCUMENTS

| | | |
|---|---|---|
| KR | 10-2013-0053512 A | 5/2013 |
| KR | 10-2013-0094621 A | 8/2013 |

OTHER PUBLICATIONS

Kuo et al, "Nitride-Based LEDs With Phosphoric Acid Etched Undercut Sidewalls," IEEE Photonics Technology Letters, vol. 21, No. 8, Apr. 15, 2009, pp. 510-512.

* cited by examiner

Fig. 1
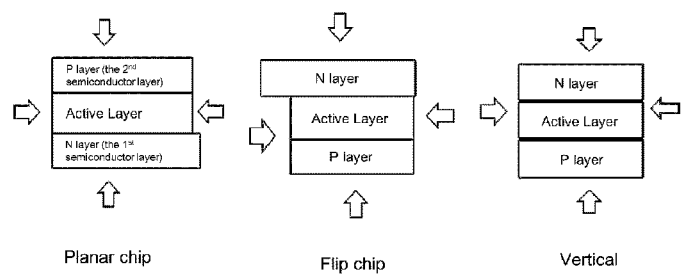
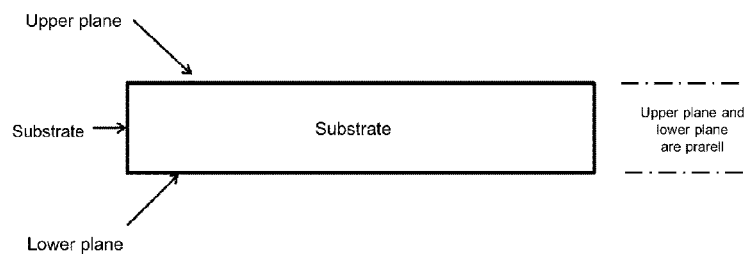
Fig. 2

The figures are examples and the size of transferred pattern is different according to the size of PR pattern.

Size of curves on active layer > size of curves on a substrate or on a
upper layer of a substrate
(Curves becomes more gentle as height goes up to be flat on the top)

Flat active layer

Active layer with up   Flat active layer and
and down curves       curves on side wall       Active layer with curves
                                                and curves on side wall x and + mean the cases that peaks are located over an upper plane and troughs are located under an upper plane respectively. In case of forming curves on an upper planar layer on a substrate, peaks and troughs exist in the upper layer.

Example. Area of 1 chip (a x b)

Examples of chip size and arrangement

A and B may be A', A", A'", etc. and B', B", B'", etc. where curves are formed with different curvatures respectively and among these As and Bs, C without curvature may be arranged. As and Bs and C may be connected smoothly with curve.

Imaginary plane of extended active layer

Imaginary plane of extended active layer

SUBSTRATE AND LIGHT EMITTING DIODE

TECHNICAL FIELD

The present invention relates to substrates enhancing the output of light emitting diodes and the structure of the diodes using the substrate.

BACKGROUND ART

Upper plane and lower plane of a substrate are parallel in conventional technology. Active layer formed on the upper plane is conventionally parallel to the upper plane and lower plane of a substrate. In addition, the ordinary outer plane of a chip with hexahedron shape is a rectangular cutting section. The shape of each layer revealed on the cross sections facing outside is straight lines, which is equivalent to a case of an artificial cross section imaginably formed perpendicular to the outer plane inside the chip.

(Non-patent reference 1) "Nitride-Based LEDs with Textured Side Walls"

(Non-patent reference 2) IEEE PHOTONICS TECHNOLOGY LETTERS, VOL. 16, NO. 3, pp 750-751 MARCH 2004

(Non-patent reference 3) "Nitride-Based LEDs with Phosphoric Acid Etched Undercut Side Walls"

(Non-patent reference 4) IEEE PHOTONICS TECHNOLOGY LETTERS, VOL. 21, NO. 8, pp 510-512 Apr. 15, 2009.

DISCLOSURE OF INVENTION

Technical Problem

The quantity of light emission is increased maintaining the planar size of a chip. To achieve this goal, the dimension is maintained equally and the area of active layer is increased. On the other hand, the area of the active layer exposed on the edge side face is increased. Then again, utilization rate of emitted light is increased by directing the light emitted from the edge side face of a chip to the front.

Technical Solution

The light emitting diode of this invention includes active layer which is not parallel to reference plane.

In addition, according to one aspect of the present invention, the active layer is curved.

In addition, according to other aspect of the present invention, the active layer is slanted.

In addition, according to another aspect of the present invention, the edge side faces are curved.

In addition, according to another aspect of the present invention, the edge side faces are slanted.

The substrate of the present invention comprises the upper plane which is not parallel to the lower plane. That is, the upper plane of the substrate is discrepant from the lower plane. This upper plane includes one or more curves. In addition, the upper plane includes one or more gradients.

The substrate of the present invention includes upper plane and lower plane, wherein one or more upper layers are formed on the substrate and one or more of the layers keep is discrepant from the lower plane. This upper plane includes one or more curves. In addition, the upper plane includes one or more gradients.

The substrate according to this invention includes upper plane and lower plane against horizontal reference plane, wherein the lower plane is place to be discrepant from the reference plane.

The light emitting diode according to this invention includes a substrate comprising upper plane which is discrepant from lower plane.

The light emitting diode according to this invention includes a substrate with upper plane and lower plane. One or more upper layers are formed on the substrate. One or more of the one or more upper layers are discrepant from the lower plane. There are curves on the side edge faces of the diode.

A light emitting diode according to this invention includes one or more substrates, wherein the substrate comprises an upper plane and a lower plane against horizontal reference plane and the lower plane is placed to be discrepant from against the reference plane.

Advantageous Effects

When the structure of this invention is applied, the quantity of light emission per unit planar area of a chip (unit projected area of active layer, unit installation area of active layer) and the area of active layer revealed is increased, resulting the amount of light emission through the side edge faces increased and the total quantity of light emission by directing the light emitted to the front enhanced.

BRIEF DESCRIPTION OF THE DRAWINGS

FIG. 1 is a view showing the outline of conventional light emitting diode.

FIG. 2 is a view showing conventional substrate.

BEST MODE FOR CARRYING OUT THE INVENTION

There are three types of light emitting devices (or light emitting diodes) as shown in FIG. 1. Arrows indicate surface planes respectively. Surface planes of a device are the most outer planes of the structure forming a chip. In case of surface curves, a straight line type or a concave downward and upward curve line type successive pattern is applied along the vertical cross section. A certain geometry including quadrilateral (square, rectangular, trapezoid etc.) and sphere can be overlapped. It is also possible to apply irregular surface roughness, which is called as roughening process.

Figure 3:
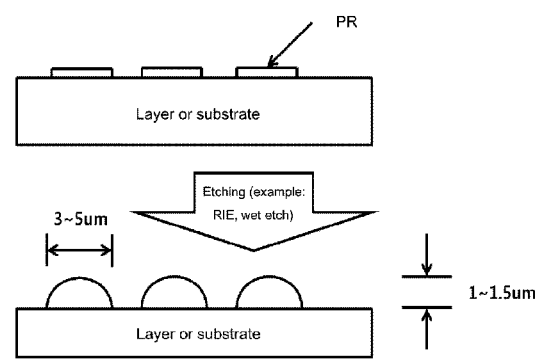
FIG. 3 is a view showing processing conventional pss (patterned sapphire substrate) patterns.
Figure 4:
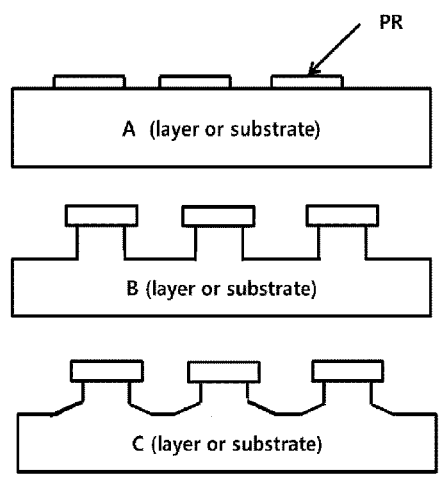
FIG. 4 is a view of pattern forming method.

A substrate where the light emitting diode is formed includes an upper plane and a lower plane as FIG. 2. Conventional pss pattern of FIG. 3 is formed with photolithograph process by applying PR patterns on a substrate (ex, sapphire). The forms of patterns or curves such as B or C of FIG. 4 show that a shape of etched patterns varies according to crystal faces.

Figure 5:
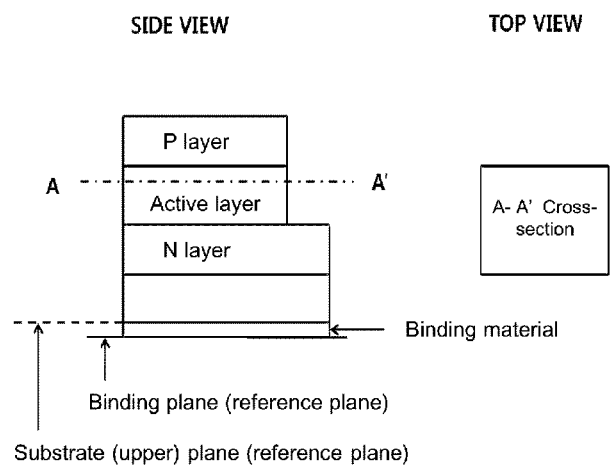
FIG. 5 is a view of conventional light emitting diode including a substrate.

FIG. 5 show that the area of active layer (cross section area, the area of A-A' plane) is parallel to the substrate (reference plane) where the chip is formed and the size of active layer area and the size of the projected area on the substrate are equal in case of hexahedron. If the active layer of a hexahedron shape chip is not parallel to reference plane, the size of the active area projected to the reference plane or an engaging plane as a base plane can be different from the size of the area on the active layer plane. This invention which is embodied with the technical constructions as above includes cases as follows in relation with the active layer of a light emitting device.

Figure 10:
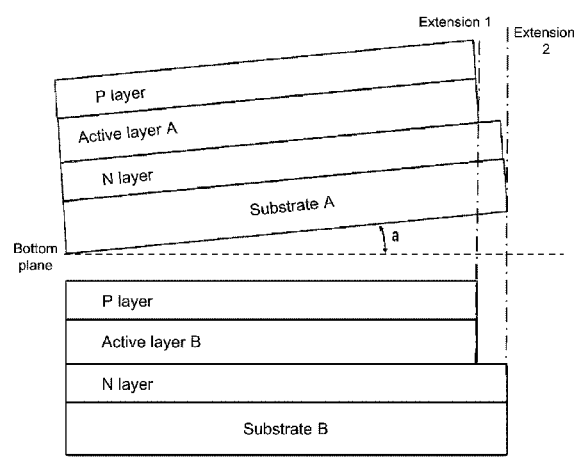
FIG. 10 is a view of the cross section of slanted planes.
Figure 23:
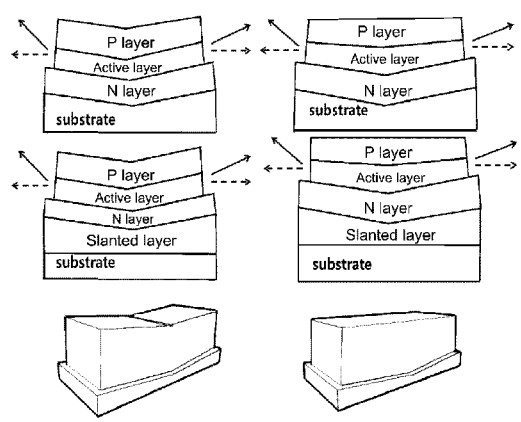
FIG. 23 is a view showing the change of light emitting direction.

The first case of tilted active layer plane (FIG. 6) is applying gradients both vertically and horizontally or separately (the vertical gradient means the angle applied between a vertical line and a normal vector on each small area which is made by dividing active layer plane). With the structure, the total light emitting area comprised of the light emitting area of an active layer plane and the revealed area of the active layer on the four edge side faces is increased. In addition, the active layers revealed on the edge side faces aim forward rather than the sides (refer to FIG. 10, FIG. 23. and FIG. 41 to FIG. 44). In this context, the gradients can be formed on the tilted upper plane of a substrate or the tilted upper layers on the upper plane of a substrate, realizing the slant of active layer.

Figure 7:
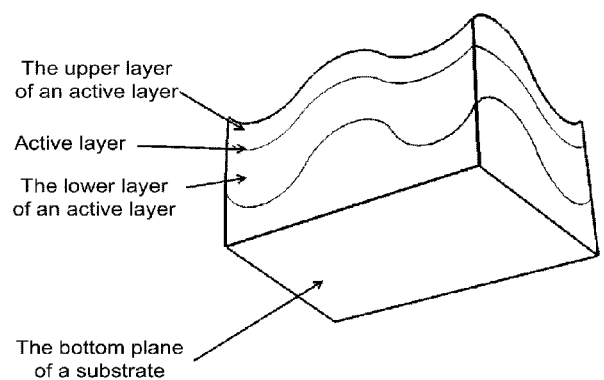
FIG. 7 is a view of the embodiment 1 of the structure with curves.
Figure 8:
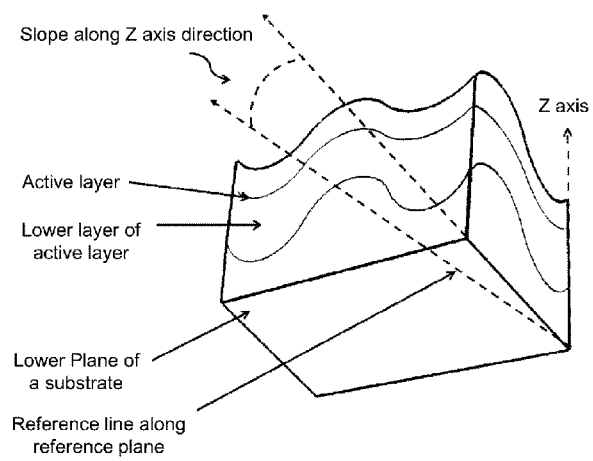
FIG. 8 is a view of the embodiment 2 of the structure with curves.

The second case of applying curves to active layer can be adopted in addition to the first case that each small area of the active layer has gradients against horizontal and vertical direction respectively or together. Total size of the active layer area which is formed as described produces the effect of increased area as compared with the case that the active layer is parallel to reference plane (upper plane of a substrate or engaging plane of a substrate) or the case that the active layer is slanted. The revealed area of the active layers on the edge side walls is increased too (FIG. 7, 8, 9, 45, 46, 47). In this context, curves can be formed on the curved upper plane of a substrate or the case of the curved upper layers on the upper plane of a substrate, realizing the curves of active layer. These curves can be formed regularly or irregularly. The curves can be extended as a form of continuous rising and falling of a plane.

To make a tilted or curved plane, a mask is formed and etching is done on the target plane. After etching, upper layer can be formed with methods including epitaxy over the curves. These upper layers may include active layer.

Each case is subdivided and explained in detail. In case of tilted active layer as in FIG. 10, the actual size of the area of active layer area of A is larger than the size of active layer area of B which is equal to the size of the projected area of A into the base plane (reference plane, parallel plane) of A. The increase of the area of the active layer as one of the effects obtained from tilted planes against the reference plane is as follows.

The length of substrate B=the length of substrate A×cos a

Figure 12:
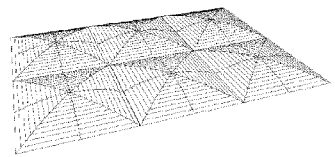
FIG. 12 is a view of curved planes illustrated with contour lines.
Figure 13:
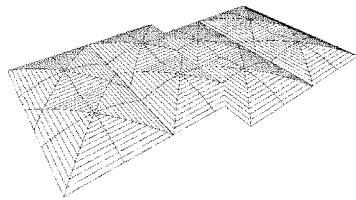
FIG. 13 is another view of curved planes illustrated with contour lines.

The length (or area) of active layer B=the length (or area) of active layer A×cos a→the length (or area) of active layer A>The length (or area) of active layer B If this type of tilted planes with an area of a certain size are placed with different angles respectively, surfaces with concave downward and upward (refer to FIG. 11) and arcs (refer to FIG. 12) are formed. These convex arc type curved surfaces can be connected irregularly (refer to FIG. 13). If the surfaces formed with arcs placed in the opposite direction are connected continuously, bigger curves are formed. In this context, the size of the curve is incomparably much bigger than the size of pss patterns. One chip (the size of one chip) can be placed on a part of a curve. One chip can formed across several curves too. In this context, ELOG (Epitaxial Lateral Overgrowth) cannot be expected with these curves. In case of conventional pss (patterned sapphire substrate) patterns applied to upper plane of a substrate, the pattern size (ex. the level of a few micrometer) is the level to enable processing ELOG; therefore, it is not the curves of this invention. In addition, these pss patterns do not affect the gradient of upper layer of a substrate in relation to a reference plane.

Examples of active layers with curves (concave downward and upward, curved face) can be divided as follows.

The first case is that all or some part of active layer is a curved surface (curves are formed toward the first and the second semiconductor layer on the area of an active layer inside a chip).

The second case is that all or some part of the revealed active layer on the edge side faces is curved surface (the edge of active layer which is revealed on the outer cross section of a chip is shown as curves which is not covered by the contact of the first and the second semiconductor layer each other and the active layer is not covered.)

The third case is that two or more cases of the four cases as described above are overlapped. The effect of applying these curved faces is as follows.

If active layer is formed with curves, the total size of area of the active layer is increased in comparison with flat quadrilateral cross section; therefore, the quantity of light emission is increased compared with the case of the same projected area of a chip.

Figure 9:
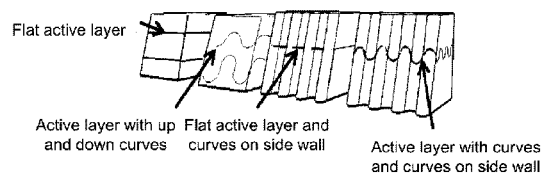
FIG. 9 is a view of the embodiment 3 of the structure with curves.

In addition, if the side faces of a chip are formed with not-flat cross section (formed with curved surface), the area of revealed active layer is increased. To increase the directly reveled outward area of active layer, artificial curves can be formed on the side faces (refer to FIG. 9 and FIG. 13: FIG. 9 is a case to add gradient to a chip itself in relation to FIG. 13). In that case, the quantity of light emission is more increased compared with the case of the same projected area of a chip. In case of a vertical type chip, same effect happens too. As an example, right and left asymmetry patterns are applied repeatedly on the edge of a chip as in FIG. 15 (top view of vertical type LED).

To maximize increasing the total amount of active layer area with same cross section area and the total amount of the revealed area of active layer, it is possible to apply gradient additionally to curved active layer as a whole; to tilt the substrate itself; or to form gradient or angle on edge side walls as a whole.

This invention including these examples in relation to light emitting diodes is characterized by adopting non planar active layer. The cases adopting non planar active layer includes tilted and/or curved active layer. The embodiments of these light emitting diodes are as follows.

According to the light emitting diode of this invention, light emitting diodes with uneven or curved surfaces are cases of the device including nonplanar active layer with roughened or patterned surfaces. As an example of nonplanar active layer, curves which have the size of not causing ELOG can be formed on the active layer inside a light emitting diode and the revealed active layer at the edge side faces of a light emitting diode.

This invention related to a light emitting diode is characterized in including tilted and/or curved active layer and the revealed face of nonplanar active layer.

This is the case to maximize the revealed area of active layer by etching the side walls of a device.

To embody these light emitting diodes, 1_the shape of a surface of a substrate is transcribed to the structure of the device; 2_the substrate is placed to be tilted against reference plane; and 3_photolithography can be utilized.

Figure 16:
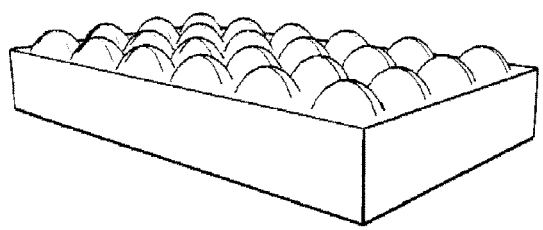
FIG. 16 is a view showing three dimensional structure of curved plane.
Figure 17:
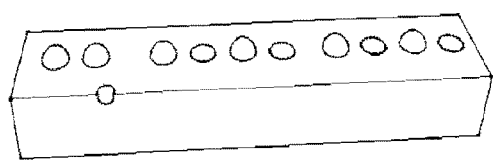
FIG. 17 is another view showing three dimensional structure of a curved plane.
Figure 18:
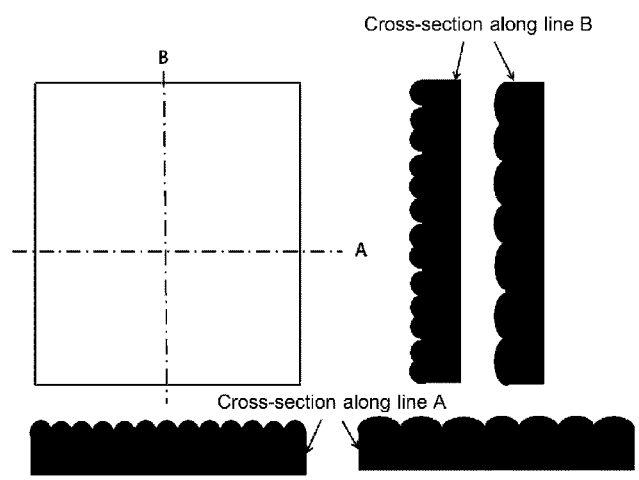
FIG. 18 is a view showing a sample of continuous curves.

One of the technical constructions of this invention is related to a substrate (FIG. 17) with curved upper plane formed by convex or concave plane (FIG. 16) in turns. These convex and concave hemisphere surfaces are examples of curves comprising unevenness formed by etching upper plane of a substrate downward (FIG. 18). These shapes are left and right symmetry or asymmetry. The sizes of continuous structures comprising concave and concave planes; convex and convex planes; and convex and concave planes which are observed on cross sections do never allowing ELOG (Epitaxial Lateral Overgrowth). It is possible to achieve the increase of the area of active layer in comparison to the area of the active layer projected on the cross section only when the layer grows without ELOG. Therefore, the curves of this invention mean the geometrical shape with the size not allowing ELOG. Epitaxy is done along the curves.

In addition, a variety of embodiments are available according to the shape or material of curves. From the viewpoint, this invention of a substrate with upper plane comprising curves made of concave and convex surfaces in turn is characterized in that the convex and concave surfaces are formed of the same material with the substrate (FIG. 18). It is possible to make the curves by etching a substrate or applying other physical methods (ex, grinding).

Figure 19:
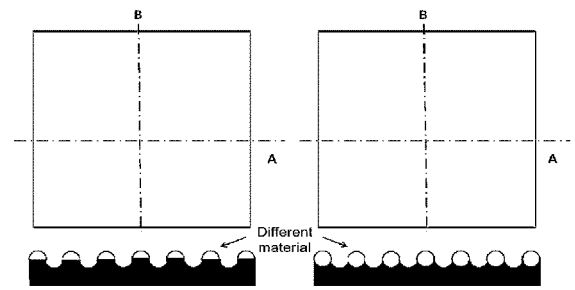
FIG. 19 is a view showing curves formed with different material on a substrate.

In addition to that, this invention of a substrate with upper plane comprising curves made of concave and convex surfaces in turn is characterized in that the convex and concave surfaces are formed of material different from that of the substrate (FIG. 19). These curves can be formed in the following order. Concave parts of the curves are formed first and convex parts of the curves are formed with different material later. In relation to that, another embodiment of the light emitting diode of this invention is to vary the shape of the active layer plane with forming concave and convex surfaces by etching a substrate with patterns formed on the substrate rather than the shape of a substrate itself In addition to the construction, this invention of a substrate with upper plane comprising curves formed of concave and convex surfaces in turn may include the secondary patterns formed along the curves consisted of the concave and convex surfaces. The secondary patterns may enable ELOG partially or totally (refer to FIG. 20).

Figure 21:
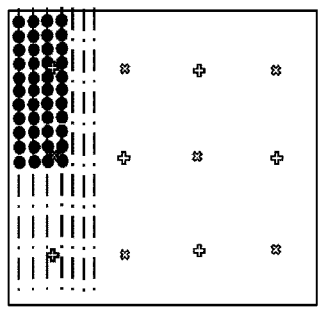
FIG. 21 is a view showing a planar plane of an example of continuous curves and secondary patterns.

In addition to the construction, this invention of a substrate with upper plane consisted of curves formed of concave and convex surfaces in turn is characterized in that the secondary patterns may be repeated. The repetitions are done regularly (refer to FIG. 21) or irregularly. In addition, patterns comprising only concave or convex faces may be repeated on the curves.

The light emitting diode, formed on the substrate, of this invention may be characterized in that nonplanar active layer is included and the shape of the active layer is the same as the shape of the upper plane of the substrate (refer to FIG. 7).

The light emitting diode of this invention may be characterized in that nonplanar active layer is included and a part of or the entire the active layer is not a planar plane.

In addition, the light emitting diode of this invention may be characterized in that nonplanar active layer is included and the active layer is revealed on a part of the device surface (refer to FIG. 7).

Figure 14:
FIG. 14 is a view showing an example of curves on edge faces.

In addition, the light emitting diode of this invention may be characterized in that nonplanar active layer is included and a part of or the entire cross section on which the active layer is revealed is curved plane (refer to FIG. 14). The curves may be comprised of straight planes placed in zigzag type or arc type planes placed repeatedly. To embody the shape (straight or arc type curves) on the plane where active layer is revealed as in FIG. 14, conventional photolithography is applied. 8 type samples adopting the structure as described above were prepared to test "Light Extraction Efficiency Change by Texturing on MESA Side Wall of GaN Based LED with the process set-up to make a side wall textured LED.

During the process for preparing mesa and a site for n-electrode, side wall texturing structure of this experiment was formed at the same time and ICP conditions for side wall texturing is the same as that of normal samples; therefore, there is no additional photolithography step as compared with conventional LED manufacturing processes and there is no additional damage caused by plasma because ICP etching condition is same.

The Von voltages of Side wall etched and conventional LED samples did not show any significant difference. The leakage current of each sample did not show any significant difference too.

Light Extraction Efficiency of the side wall texturing samples shows the increase of 35% to 45% at 20 mA when photodetector is applied." (National Assembly Library Call Number TM 621.3-11-525 Light Extraction Efficiency Change by Texturing on MESA Side Wall of GaN Based LED/Hongseo Yom)

Figure 48:
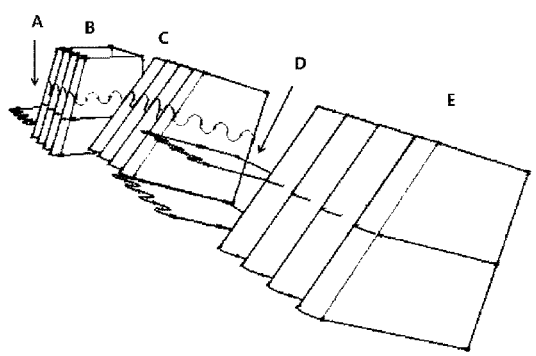
FIG. 48 is a view showing the gradient applied to a chip and the slanted curves on the edge side faces.

Corresponding to FIG. 14, FIG. 48 in which the technical idea of this invention is expressed illustrates a gradient applied to a chip and another gradient applied to side faces. "A" shows the bottom plane of a chip in case that curves are applied to the edge side faces of the chip. "B" represents a case of applying both curves and gradient to the edge side faces at the same time. Planar active layer and curved active layer revealed on the edge side faces are expressed on one type curved tilted faces. "C" is the case that the edge of a chip with curved active layer is etched with gradient and an angle is applied to the chip itself additionally. "D" shows the active layer and bottom plane which are tilted while the layer and the plane is maintained as planar. "E" is a case that the edge of a chip including planar active layer is etched with an angle and another angle is applied to the chip itself additionally.

As a result of embodiment of the structure as described, the curved plane of active layer formed in a chip increases the intensity of light emission per unit area of the reference plane on which the curved plane of active layer is projected. In addition, the curved surface formed with revealed active layer on the edge of a chip increases the area of revealed active layer and the intensity of light emission with the effect of directing the light emission forward together.

The light emitting diode of this invention is characterized in that active layer is not parallel to horizontal plane. Conventional technology shows that upper plane and lower plane of a substrate are parallel to each other and active layer is usually parallel to the upper plane and the lower plane too. This invention is characterized in that active layer plane is not parallel to upper plane or lower plane of substrate or lower binding plane (hereinafter reference plane), to which a finished chip is bound, as horizontal plane. (Refer to FIG. 22)

The description of active layer (or the cross-section of active layer) which is not parallel to reference plane means that the active layer may be 1_slanted plane or 2_curved plane or 3_slanted curved plane.

The light emitting diode of this invention is characterized in that active layer is not parallel to (or non-parallel or crossed with) horizontal plane and the cross-section of the active layer is at an angle to the horizontal plane. (Refer to FIG. 22)

Epitaxy on a substrate with slanted upper plane can be the first example case that active layer is slanted plane.

Figure 6:
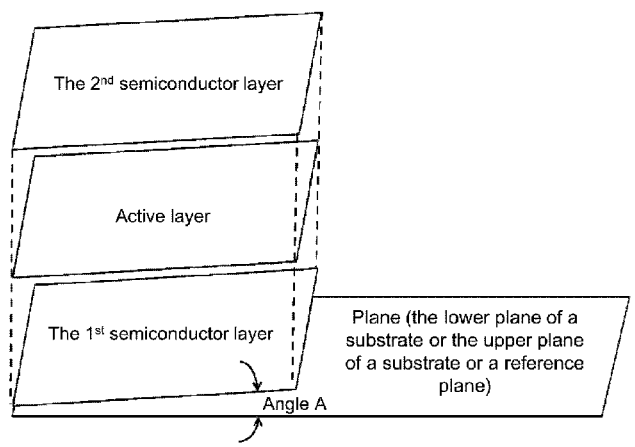
FIG. 6 is a view of slanted planes.

FIG. 6 shows an example of a light emitting diode characterized in that the cross-section of active layer is placed to be parallel to a plane (the upper plane of a substrate) with angle A to the lower plane of the substrate which is horizontal. Effects in case that a light emitting diode is formed on the slanted plane are as follows.

a_The area of active layer formed inside a chip is increased in comparison with the projected area which is the same as that of conventional light emitting diode which is parallel to the lower plane of a substrate, resulting increased light emission with same dimensions of planar plane. (Refer to the effect of slanted plane in relation with FIG. 10 which is mentioned before)

b_In case that curves are formed on the edges along vertical direction (by conventional photolithography processes, the revealed active layer area on the side faces is increased in comparison with the same dimensions of projected area. In addition, light loss is minimized too because the revealed active layer area is headed for the front direction which light need to be emitted (refer to the side curves of FIG. 14 planar chip and FIG. 15 vertical chip). In case that one chip whose area is equivalent to that of two chips is placed as a shape of slanted planes facing each other (refer to FIG. 23), more light can be emitted toward the front direction that light need to be emitted to. The top part of a chip which is flat as in the structure placed in right bottom position can be made conventional technology (Korean Patent Application Number: 1020050123314_Selective Epitaxial Growth Method).

Figure 15:
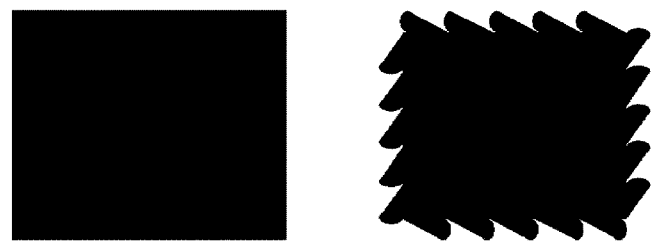
FIG. 15 is a view showing another example of curves on edge faces.

The shapes of curves formed on the side faces are shown on FIG. 14 and FIG. 15. The shape of zigzag type cross-sections formed by etching edges of a chip (side faces) with one or more straight lines; the shape of zigzag type cross-sections formed by etching edges of a chip (side faces) with one or more curved lines; and the shape of cross-sections formed with asymmetric patterns adopting straight lines and curved lines one after another are illustrated as examples.

Figure 24:
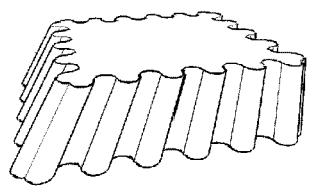
FIG. 24 is a view showing the shape of edge side faces with gradients and curves.
Figure 25:
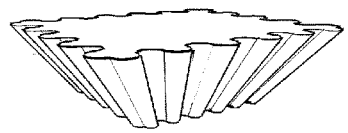
FIG. 25 is a view showing the inverted shape of edge side faces with gradients and curves.
Figure 26:
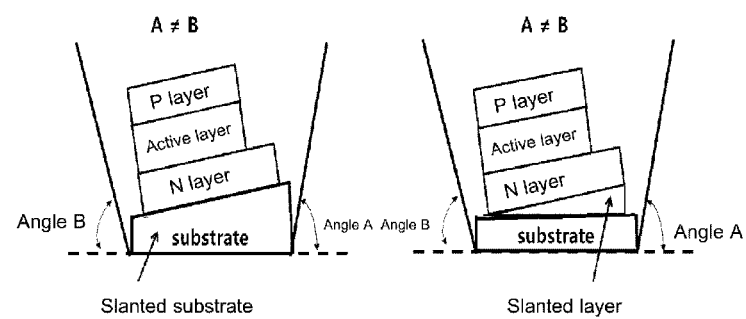
FIG. 26 is a view showing the installation example 1 of reflective planes.
Figure 27:
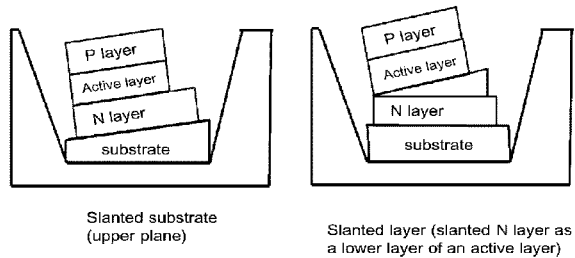
FIG. 27 is a view showing the installation example 2 of reflective planes (formed with a base).
Figure 28:
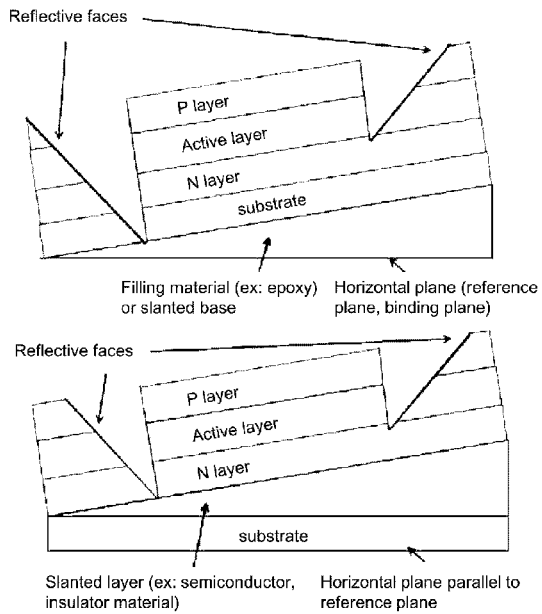
FIG. 28 is a view showing the installation example 3 of reflective planes.

When curves are formed, a gradient can be applied to face the direction for light to be emitted by photolithography processes (FIG. 24 and FIG. 25). FIG. 25 shows a shape inverted after applying slope and eliminating a substrate for growth. In addition, a reflector can be placed to increase the amount of light emitted from side faces toward the front (FIG. 26 and FIG. 27).

As the second example case that active layer is a slanted plane, slope can be applied to a substrate in the step of package processes using conventional light emitting diode structure in which the active layer is formed to be parallel with upper plane and lower plane of a substrate. This invention can be embodied as a light emitting diode characterized in that the lower plane is not parallel to a horizontal plane (binding plane) with applying the slope.

The meaning of "curves exist" can be explained as follows. According to this invention, active layer is not parallel to horizontal plane and the cross-section of the active layer is formed non-linearly on the etched faces.

Figure 29:
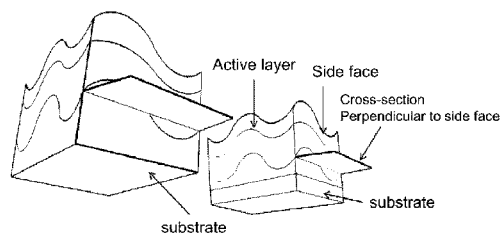
FIG. 29 is a view showing the scheme of cross-sections perpendicular to edge side faces.
Figure 30:
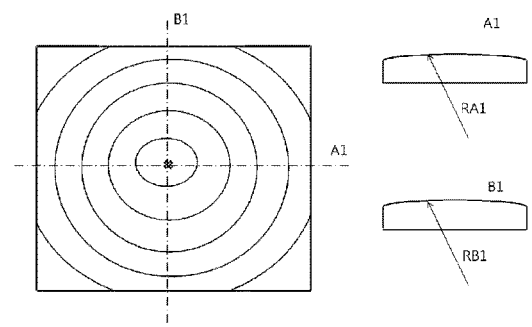
FIG. 30 is a view showing the sizes of curves.
Figure 31:
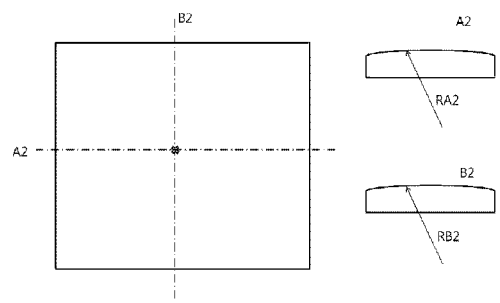
FIG. 31 is a view showing the example of convex curves corresponding to the whole area of one chip.
Figure 32:
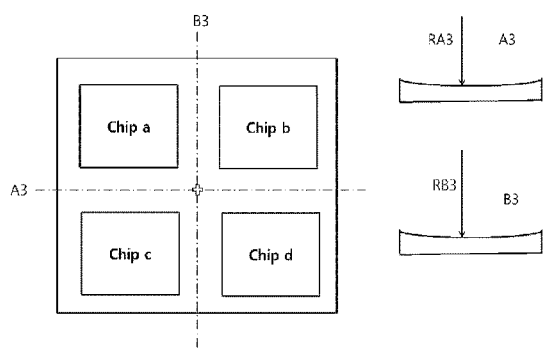
FIG. 32 is a view showing the example of concave curves on a substrate corresponding to the area with several chips.
Figure 33:
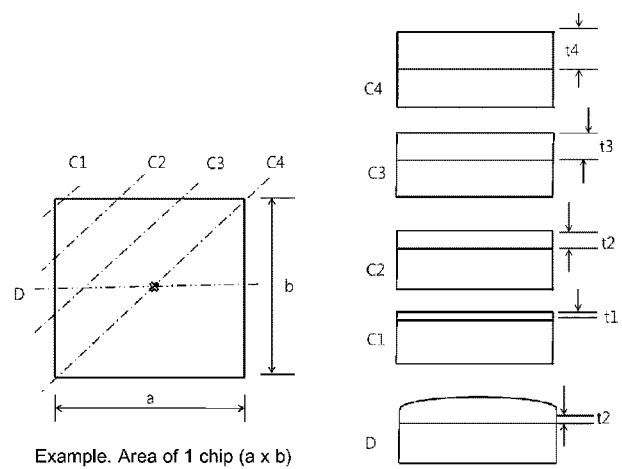
FIG. 33 is a view showing the example of the thickness change of a substrate corresponding to one chip.

FIG. 29 shows that the cross-section of active layer is formed non-linearly on the etched faces. The curves of lower layer are reflected to the non-linear active layer. The curves of lower layer are formed as the shape shown in FIG. 30. FIG. 30 is a top view of upper layer and the "x" marks shows the apex of convex curve. Concentric circles mean contour lines. RB1 and RB2 (radius of B2 section) can be applied to cross-sections of B1 and A1 respectively. These one or more curved planes (FIG. 30, FIG. 31) may exist within one chip. In addition, several chips may exist on one curve (FIG. 32). The case of thickness variation along only diagonal lines is illustrated in FIG. 33.

Figure 34:
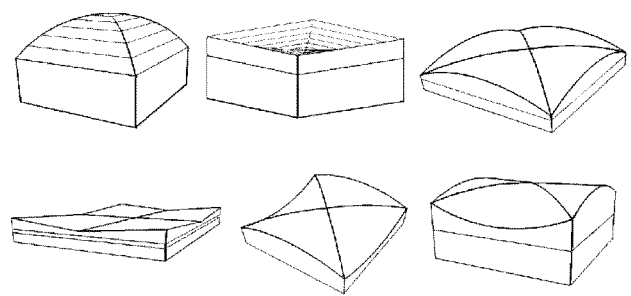
FIG. 34 is a view showing the example of the forms of curves.
Figure 35:
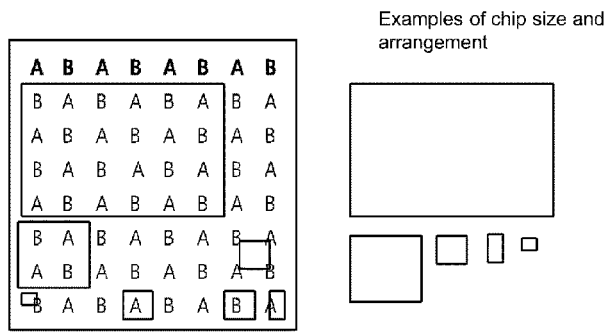
FIG. 35 is a view showing the example of the arrangement of curves on a substrate.

FIG. 34 shows upward and downward curved planes and FIG. 35 exemplifies an arrangement of curves. FIGS. 30 and 31 show that the size of every curve may be different from each other. FIG. 32 shows curves formed downwardly from upper planes as a reference level. "+" mark in FIG. 32 means the lowest point of a curve formed downwardly. FIG. 33 shows the changes of thickness of a semiconductor layer along the diagonal cross-sections as the shape of one curve on one chip. FIG. 34 may be examples one curve on one chip respectively. FIG. 35 illustrates the size and arrangement of chips in relation with the arrangement of curves on a substrate. FIG. 30 to 34 illustrate that the shape or arrangement of curves can be various as examples.

Figure 20:
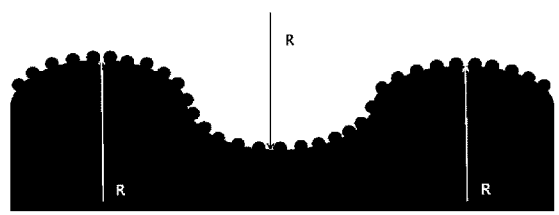
FIG. 20 is a view showing the cross section of an example of continuous curves and secondary patterns.
Figure 36:
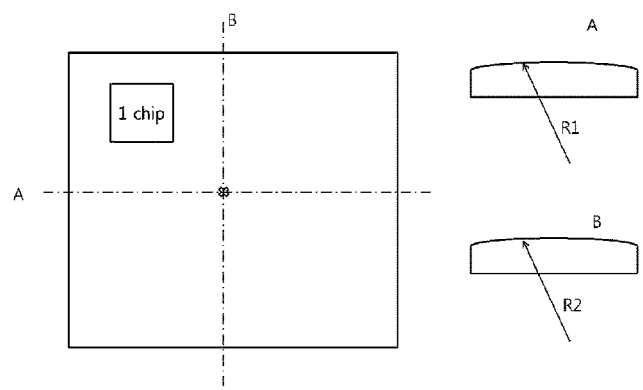
FIG. 36 is a view showing an example of a chip located on a part of curved plane.
Figure 37:
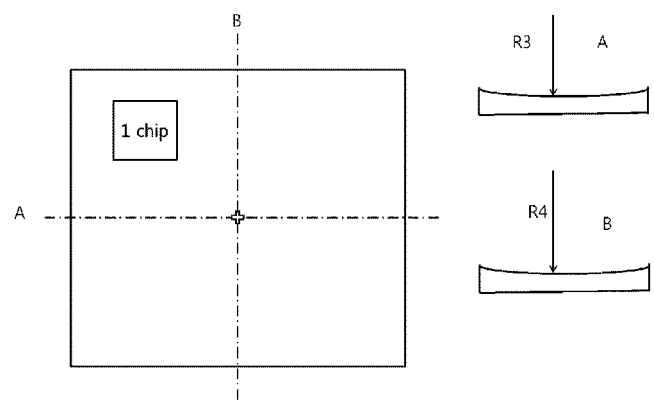
FIG. 37 is a view showing another example of a chip located on a part of curved plane.
Figure 38:
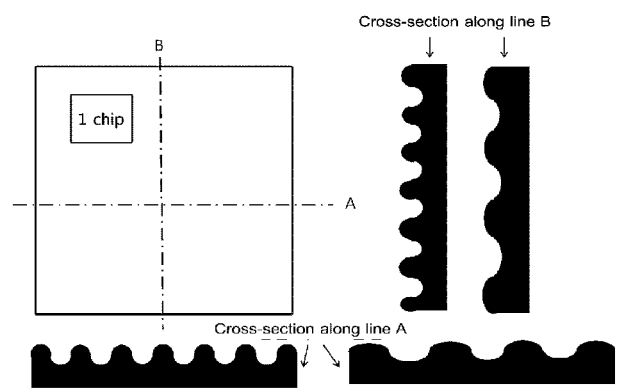
FIG. 38 is a view showing another sample of continuous curves.

FIG. 36, FIG. 37, and FIG. 38 show that (the size of) one chip can be a part of one curve or over several curves. FIG. 38 is an example case that several curves with various sizes exist over the whole area of a substrate and shows that one chip can be formed over several curves of a substrate. Blank space of a substrate suggests the possibility of existence of chips with various sizes. These curves shown in FIG. 38 can be made by conventional etching or direct processing on a substrate. In addition to the curves (cutout) made as described, patterns (ex, pss) with the size enabling ELOG (epitaxial lateral overgrowth) effect can be made by the processes of PR coating (on etched recessed cutout), pattern forming, etching, developing, and striping. FIG. 20 is an example of what described above and FIG. 21 shows that pss patterns can be formed continuously on the curves which are convex and concave on the upper plane (as a reference level) of substrate plane.

According to this invention, the cross-sections of the active layer (faces shown after etching) is revealed or formed as non-linear (straight line type curve, arc type curve) on the faces crossed with the cross-section of the active layer (or included the cross-section of the active layer) because the active layer is not parallel to horizontal plane.

Figure 11:
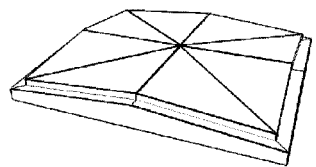
FIG. 11 is a view of the bulged and slanted plane with concaves downward and upward.
Figure 39:
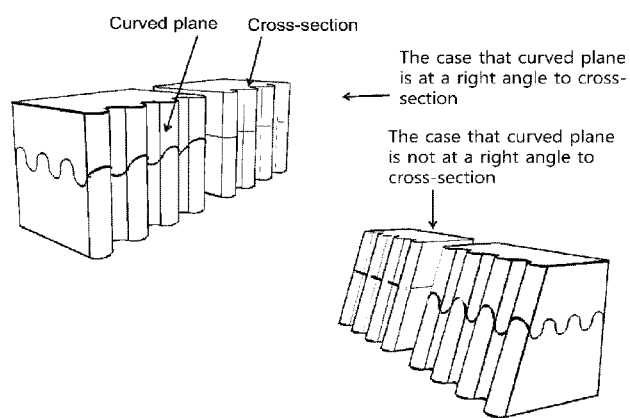
FIG. 39 is a view showing vertical curved faces and a slanted curved face.
Figure 40:
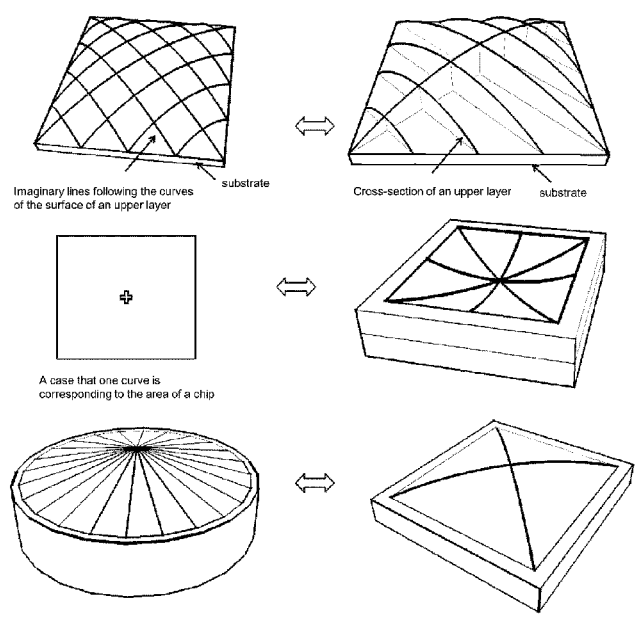
FIG. 40 is a view showing three dimensional structures of a curved plane.

As an example of active layer which is curved and not parallel to horizontal plane, curved plane on a substrate is embodied with combination of slanted planes as illustrated in FIG. 11. FIG. 11 is an example of curved planes on a substrate expressed with the combination of planes. The light emitting diode in which the active layer is formed with curved planes reflecting the curve planes as described, with the increase of the area of active layer inside the chip, in case that etching is done to make curved cross-section with any angle to the side faces (the vertical planes of edges) on which the revealed active layer is shown from outside on the edges of the chip, is characterized in that the shape of the active layer can be emerged as curves on the cross-section or any plane (a plane where shape of active layer appears) which crosses the cross-section at any angle (FIG. 39). FIG. 40 illustrates the examples of imaginary three-dimensional structures in this invention and curves can be appeared on the cross-section.

Figure 41:
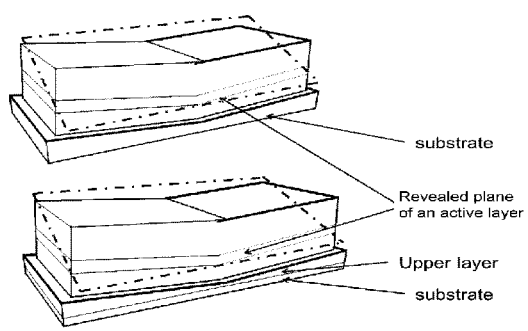
FIG. 41 is a view showing the increased area of revealed active layer on a slanted plane.
Figure 42:
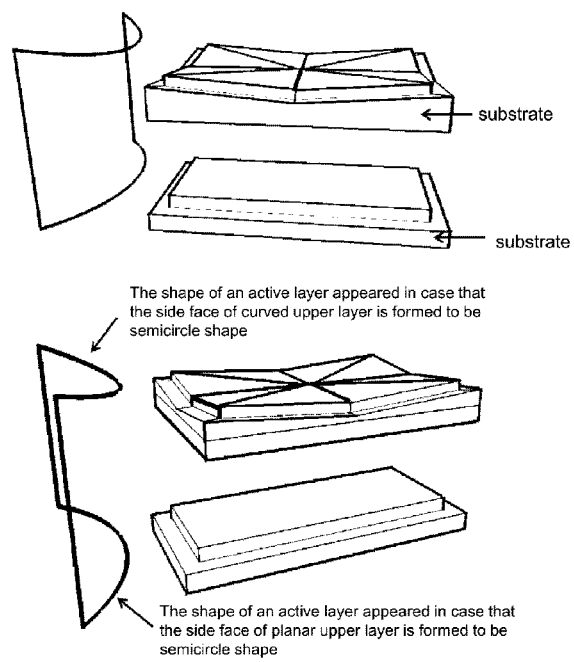
FIG. 42 is a view showing the increased area of revealed active layer with curves formed on slanted planes.
Figure 43:
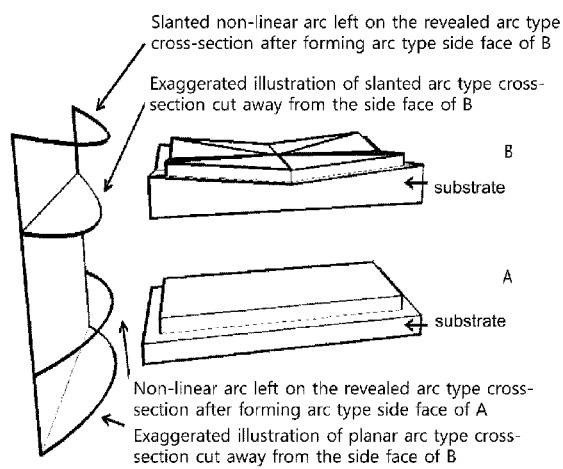
FIG. 43 is a view showing the length of slanted arc on side edge faces.

FIG. 41, FIG. 42, and FIG. 43 show the increase of the area of revealed active layers formed by combining simple straight lines or planes according to the change of revealed cross-sections. FIG. 41 shows that the area of active layers revealed with oblique lines on the side faces of the light emitting diode grown on the upper plane of a slanted substrate. These active layers may be MQW (Multi-quantum well). In case of etching side faces along the plane formed of the alternated long and short dash lines, the revealed area of the active layer is more increased. FIG. 42 shows the case of etching the side faces of the light emitting diode grown on the curves formed on slanted planes to form half circle type (or arc type) and another case etching the side faces of the light emitting diode grown on a simple plane to form half circle type (or arc type). FIG. 43 shows that the length (or area A) of slanted non-linear arc left on half circle type cross-section revealed after etching into the form of arc to the side faces formed on slanted curve of B is longer or larger than A.

(the length of slanted arc on side faces>the length of arc formed along the cross-section at a right angle to the side wall)

If active layer is formed to be tilted plane (case B) or curved plane (FIG. 12, FIG. 13) or curved and tilted plane; or curved plane digging into epi layer (the revealed shape is arc type) formed at an angle except a right angle to the cross-section (FIG. 39) according to the purpose of this invention, the area of revealed active layer is larger and the direction of light emitting is heading for the front as an additional effect meanwhile.

That is, in case that tilted and curved active layer is applied (tilted plane and the plane is curved), if a plane of an active layer formed with curves is at any angle to horizontal plane, the effective area and revealed area of the active layer is maximized to increase the amount of light emission and the direction of light emitting come to be heading for the front.

As a result of applying these structures, the device may include curves on surface. The more the shape of curves resembles hemisphere type, the more the amount of light emitting increases in case that there are curves on the surface of a device with curved and tilted active layer in comparison with another case that there is no curve on the surface of a device with curved and tilted active layer (refer to FIG. 9).

FIG. 9 illustrates examples of embodiments that curves of the substrate become gentle gradually as layers stacked increase and thus the curves of the active layer become gentler than the curves of the substrate, or upper surface without curves is formed by additional processes.

Light emitting diodes with the structure described as above of this invention is characterized in that active layer which is not parallel to or slanted to reference plane; and layer stacking structure are included. The meaning of non-parallel to reference plane is that there are slanted plane and/or curved plane against the upper plane of a substrate or binding plane as reference. The slope may be formed symmetrically. In addition, the shape may be symmetrical along circumference direction (FIG. 40) and also it can be formed of irregular slope. The curves as mentioned earlier can be made of concave and convex planes alternately. In addition, the curves above-mentioned may be made on one concave plane or a part of the plane, or one convex plane or a part of the plane.

Light emitting diodes with the structure described as above of this invention is characterized in that the layer stacking structure includes p layer, active layer, and n layer. The structure as mentioned includes all kinds of light emitting diodes such as planar, flip, and vertical type.

Light emitting diodes as described above of this invention is characterized as a light emitting device with curves on surface.

These light emitting diodes enable output, which is enhanced by expanded area of the active layer formed with layers stacked on the substrate where curved plane; or alternate planes of concave and convex; or bilaterally symmetrical slopes are formed, to escape from the device much better.

In addition, light emitting diodes with the structure may include vertical type (vertical chip), which includes stacking layers separated from a substrate where curved plane; alternate planes of concave and convex; or bilaterally symmetrical slopes are formed as well as a light emitting diode including a substrate.

Supporting substrates for vertical type may be a planar plane different from substrates for growth, and filler may be charged between curved plane formed on the surface of a light emitting diode and the supporting substrate.

Figure 44:
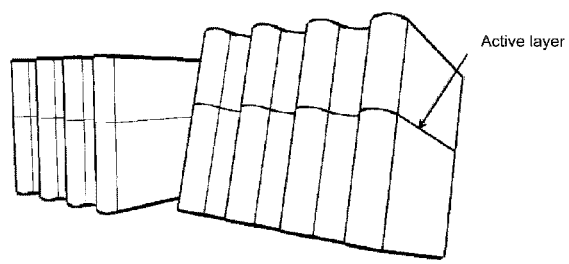
FIG. 44 is a view showing revealed active layer on the slanted edge side face.

FIG. 44 illustrates revealed faces of slanted planar active layer. In comparison with the case of side curves without slope in the left, the effect of much light emission can be expected on condition of projected area in equal size because actual size of active layer area per unit area projected is larger in case of slanted active layer in the right. In addition, there are effects that the cross-section of active layer revealed to side faces becomes wider and the direction of light emission is changed. Tilting of this case can be caused by the upper plane of a substrate or an upper layer on an upper plane of a substrate. Materials to form the slanted upper layer as mentioned can be made of AlInGaN based compound semiconductor including GaN, AlGaN, and InGaN, that is $Al_xIn_yGa_{(1-x-y)}N$ compositional formula (here, $0 \leq x \leq 1$, $0 \leq y \leq 1$, $0 \leq x+y \leq 1$). And the slanted upper layer may be not doped, or doped with n type. Before forming the slanted layer n-GaN layer is formed first on the upper plane of the substrate and a slope can be applied on the top of the n-GaN layer. At this step, photolithography methods can be applied to form the slope.

If curves are added to planar active layer on the left or tilted active layer on the right in FIG. 44, curves can be formed in the upper plane of a substrate; or a layer with curves can be formed on top of planar upper layer or tilted upper layer. Materials to form the slanted upper layer as mentioned above can be made of AlInGaN based compound semiconductor including GaN, AlGaN, and InGaN, that is $Al_xIn_yGa_{(1-x-y)}N$ compositional formula (here, $0 \leq x \leq 1$, $0 \leq y \leq 1$, $0 \leq x+y \leq 1$). And the slanted upper layer is not doped, or doped with n type. Before forming the slanted layer n-GaN layer is formed first on the upper plane of the substrate and a slope can be formed on the top of the n-GaN layer. At this step, photolithography methods can be applied to form slope.

Figure 45:
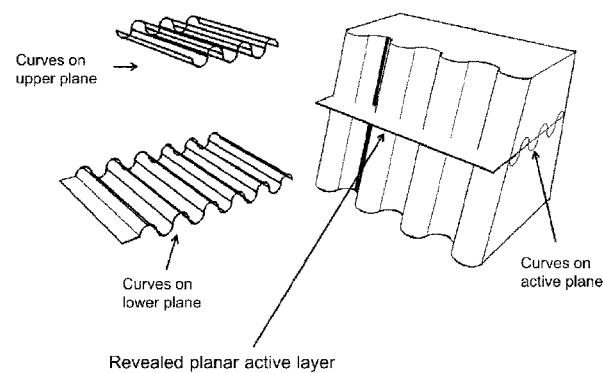
FIG. 45 is a view showing the case of curves along one direction.

FIG. 45 is an example case that active layer includes curves along one direction. The curves can be applied to tilted planar active layer of FIG. 44. These curves become a shape of wrinkle formed continuously. When curves along length and width directions cross each other, bumps are formed. The wrinkles and bumps formed at this step have dimensions not to form ELOG. Imaginary plane where curves are not formed is illustrated to help understanding.

Figure 46:
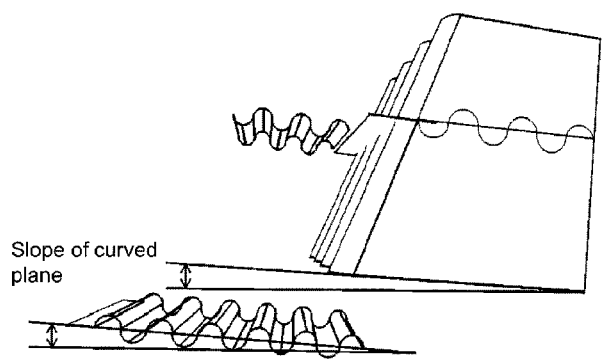
FIG. 46 is a view showing the case of slanted curves along one direction.

FIG. 46 is a case that curved plane along one direction is slanted and illustrates slopes of FIG. 44 or FIG. 45 in view of side face. The slope of a chip itself and the slop of curved plane (active layer) are illustrated.

Figure 47:
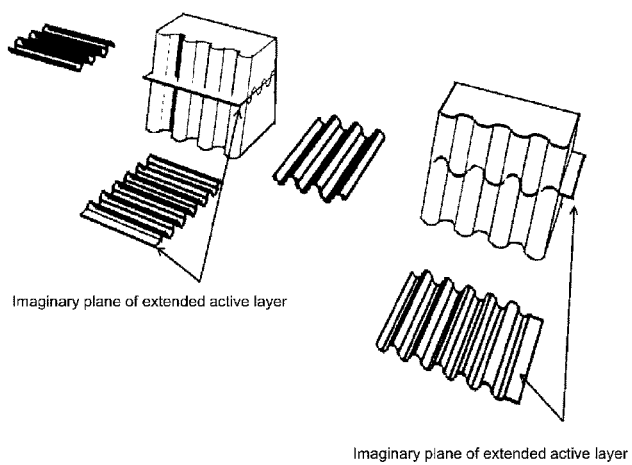
FIG. 47 is a view showing active layer with one directional curves as under layer and upper plane on it.

FIG. 47 illustrates the active layer with one directional curves as a lower plane and curves formed on the upper plane. Curves formed at a right angle to the curves illustrated in FIG. 45 are contrasted.

In addition to what is described above, the slop of chip itself and slanted curves on side face of a chip are illustrated in FIG. 48 with five samples. "A" illustrates the lowest plane of side face curves of a chip. Methods to form these curves include etching. "B" illustrates that side curves with the lowest plane such as described are slanted and expresses cases that active layer is formed as planar plane or formed with curves. "C" shows the slanted shape of chip itself which includes curved active layer and side curves. The slope can be embodied by slanted substrate or a slanted layer among the upper layers on a substrate and it can be applied to embodiments related with the slop of active layer (refer to FIGS. 22, 23, 26, 27, and 28). "D' shows the slope of bottom plane of a chip and active layer plane. If active layer is projected downwardly, it is obvious that a part of bottom plane is overlapped. "E" illustrates that planar active layer without curves slant together with slanted side curves.

What is described above about FIG. 22 can be explained in detail as follows. This invention related to examples illustrated in "C" and "D" is about a substrate with upper plane which is non-parallel to (keeps varying level along or is discrepant from) lower plane (or reference plane) and a light emitting diode including the substrate. Curves can be included with this upper plane and more than one curve can be repeated continuously. In addition, the upper plane can be slanted and includes curves furthermore. In addition, side faces include curves and the curves can be slanted.

This invention related to examples illustrated in FIGS. 22B and E is about a substrate which includes upper plane and lower plane wherein one or more upper layers are formed on the substrate, and one or more of the upper layers keep changing level with the lower plane; and a light emitting diode including the substrate. The upper layer slanted may include one or more curves or slopes. In addition, side faces include curves and the curves can be slanted.

Figure 22:
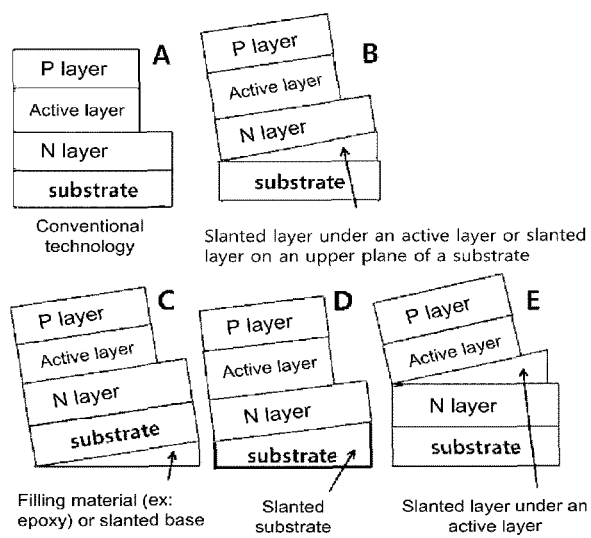
FIG. 22 is a view showing examples of substrate gradients.

C of FIG. 22 illustrates a substrate which includes upper plane, lower plane, and horizontal reference plane and the reference plane and the lower plane are placed to be discrepant from each other. D of FIG. 22 illustrates a light emitting diode including a substrate with upper plane which does not match up with lower plane as an example of this invention. The light emitting diodes may include curves on side faces.

Figure 49:
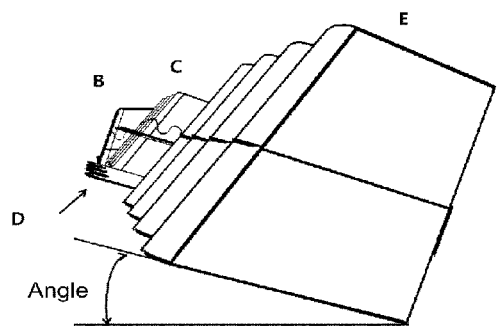
FIG. 49 is a view showing any angle of the tilted chip itself
Figure 50:
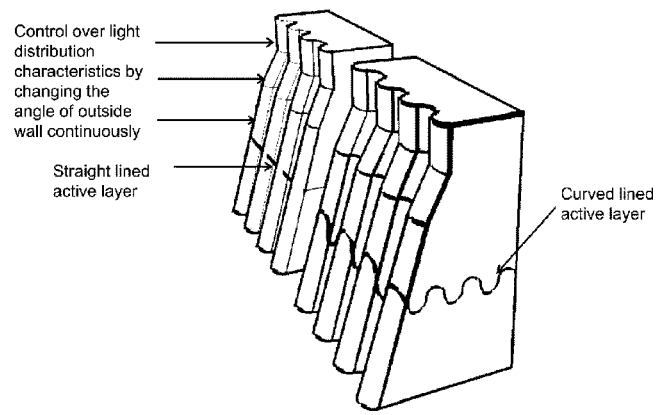
FIG. 50 is a view showing an example controlling light distribution characteristics by changing the angle of edge side faces of a chip successively.
Figure 51:
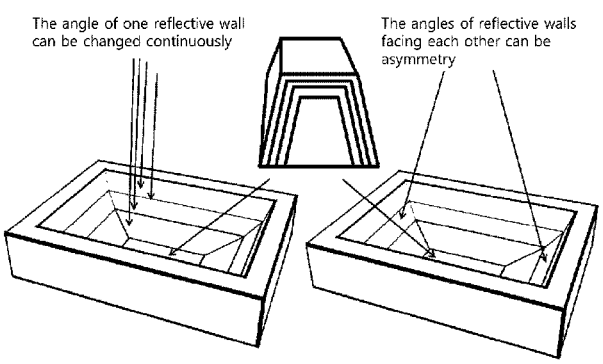
FIG. 51 is a view showing examples of asymmetry and successive angle change of reflective walls surrounding a chip.
Figure 52:
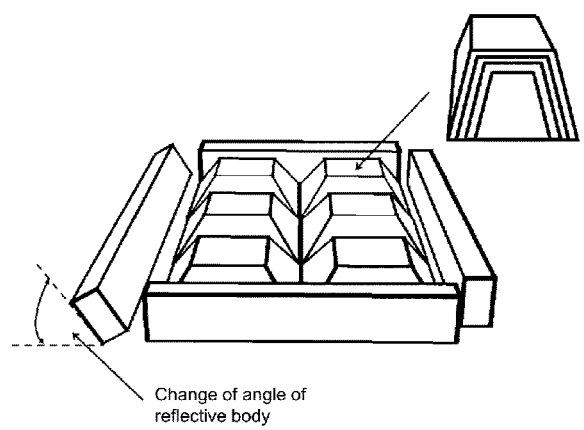
FIG. 52 is a view showing examples of the structure of outer walls surrounding one or more chips and a gradient of a reflector.

FIG. 49 explains that the amount of slope angle of a chip itself can be chosen. Considering light distribution characteristics and proper light output, the angle can be decided. FIG. 50 as an example to control the characteristics of light distribution by changing the angle of outside wall continuously can be applied to cases of planar, curved, or slanted active layer. FIG. 51 shows that the angle of reflective wall to be formed as one body around a chip may be one or more. It shows that one reflective plane includes various angle applied continuously and the angles of one or more reflective walls surrounding a chip may be different respectively. FIG. 52 shows the structure of one or more respective outside walls surrounding one or more chips and the angle of reflective wall which can be chosen. In relation with a chip comprising characteristic elements of this invention applied to FIG. 51 and FIG. 52, one or more layers with different refractive index with each other may form the outside of this chip illustrated in the center position of FIG. 51 and the right upper position of FIG. 52. Each layer with respective refractive index does not exclude to be formed by conformal coating following the outside shape of a chip. A fluorescent substance or something else can be mixed with a layer or stacked as a separate layer. This chip can be applied to not only a package with reflective bodies illustrated in FIG. 51 and FIG. 52 but also any cases unlimitedly including the case of no reflective bodies.

Figure 53:
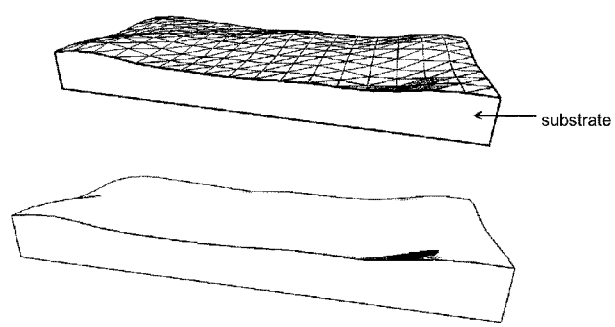
FIG. 53 is a view showing successive curves on the upper plane of a substrate.
Figure 54:
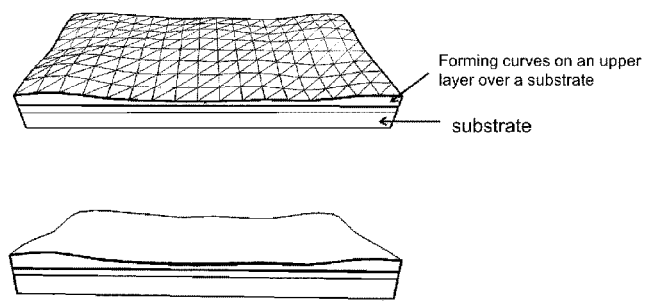
FIG. 54 is a view showing successive curves of an upper layer on the upper plane of a substrate.

FIG. 53 shows that the continuous curves of upper plane are illustrated as imaginary lines following surface to show undulating on the one hand and the curves are expressed with edge outlines on the other. FIG. 54 shows that the continuous curves of upper layer on upper plane are illustrated as imaginary lines following surface to show undulating on the one hand and the curves are expressed with edge outlines on the other. It can be understood that there may be one or more layers on a substrate; one of the layers may include curves; and layers to be formed on the layer include curves too.

The invention claimed is:

1. A light emitting diode comprising;
   a substrate;
   stacked layers including an n layer, a p layer, and an active layer formed on the substrate; and
   side walls of the stacked layers; wherein
   an upper plane or a lower plane of the substrate or a plane where the substrate is placed forms a reference plane;
   slanted active layer curves are formed on the active layer which deviate from and are slanted to the reference plane; and
   slanted curves are formed on the side walls and are slanted to the reference plane;
   one or more layers with respective refractive indices which cover the curves and maintain the shape of the curves along the shape of the curved plane of the side walls, are included;
   an area of a cross section of the active layer which is exposed by the side walls expands upwardly and downwardly;
   direct light emitting is increased with extraction from the side walls of the active layer not passing through the n layer and the p layer; and
   slope is partially different along the direction of the height of the side walls.

2. The light emitting diode according to claim 1, wherein two or more slopes along the height of the side walls are respectively different.

\* \* \* \* \*